United States Patent
Shingai

[19]
[11] Patent Number: 5,955,778
[45] Date of Patent: Sep. 21, 1999

[54] LEAD FRAME WITH NOTCHED LEAD ENDS

[75] Inventor: Tadayuki Shingai, Kumamoto, Japan

[73] Assignee: NEC Corporation, Tokyo, Japan

[21] Appl. No.: 08/944,558

[22] Filed: Oct. 7, 1997

[30] Foreign Application Priority Data

Oct. 8, 1996 [JP] Japan .................................. 8-267438

[51] Int. Cl.⁶ .......................... H01L 23/495; H01L 23/50
[52] U.S. Cl. .......................... 257/666; 257/698; 257/776; 257/674; 257/692
[58] Field of Search .................................. 257/666, 692, 257/674, 776, 784, 690, 786, 698, 696

[56] References Cited

U.S. PATENT DOCUMENTS

| | | | |
|---|---|---|---|
| 4,987,473 | 1/1991 | Johnson ................................... | 257/666 |
| 5,463,250 | 10/1995 | Nguyen et al. .......................... | 257/692 |
| 5,530,281 | 6/1996 | Groover et al. ......................... | 257/692 |
| 5,585,667 | 12/1996 | Asanasavest ............................. | 257/692 |
| 5,717,252 | 2/1998 | Nakashima et al. ..................... | 257/784 |

FOREIGN PATENT DOCUMENTS

| | | | |
|---|---|---|---|
| 57-7953 | 1/1982 | Japan ..................................... | 257/666 |
| 59-103365 | 6/1984 | Japan ..................................... | 257/666.1 |
| 62-239560 | 10/1987 | Japan ..................................... | 257/666 |
| 2-246126 | 10/1990 | Japan ..................................... | 257/692 |
| 2-307233 | 12/1990 | Japan ..................................... | 257/692 |
| 4-96356 | 3/1992 | Japan ..................................... | 257/666 |
| 4-163952 | 6/1992 | Japan . | |
| 5-190753 | 7/1993 | Japan . | |
| 5-343590 | 12/1993 | Japan ..................................... | 257/666 |
| 6-21303 | 1/1994 | Japan ..................................... | 257/666 |
| 6-21304 | 1/1994 | Japan ..................................... | 257/666 |

*Primary Examiner*—Tom Thomas
*Assistant Examiner*—Alexander Oscar Williams
*Attorney, Agent, or Firm*—Young & Thompson

[57] ABSTRACT

A lead frames has a forked top portion which has a recessed portion adjusted for receipt of a wire so that the wire is so caught by the forked top portion as to prevent the wire from being largely carried. Even if the density of the wires is high, the wires are not carried by the flow of the molten resin so that the wires are kept from contact with each other thereby avoiding short circuits. At the corners, the distance of the adjacent two wires is narrower than the other positions. Notwithstanding, the wires at the corners are also prevented by the forked top portion of the lead frame from being largely carried by the flow of the molten resin so that the wires are kept from contact with each other thereby avoiding short circuit.

5 Claims, 6 Drawing Sheets

LEAD FRAME WITH NOTCHED LEAD ENDS

BACKGROUND OF THE INVENTION

The present invention relates to a lead frame for wire-bonding and a method of forming a semiconductor device by use of the lead frame.

FIG. 1 is a plane view illustrative of a lead frame to be used for wire-bonding and resin-sealing. Lead frames 2 radially extend from an island 4. A tie-bar 7 extends across the lead frames 2 so that the tie-bar 7 is in the form of the four sides of square. A gate 8 is formed at one corner of the square. The bonding processes will be described with reference to FIGS. 2A through 2D.

With reference to FIG. 2A, a wire 1 is bonded by a capillary 5 on a pellet 3 on an island 4 around which leads 2 are provided.

With reference to FIG. 2B, the capillary 5 is moved toward the lead 2 to form a loop of the wire 1 which extends between the pellet 3 and the lead 2.

With reference to FIG. 2C, the capillary 5 is achieved to the lead 2 and the wire 1 is bonded to the lead 2 by the capillary 5 so that the wire 1 is bonded between the pellet 3 and the lead 2.

With reference to FIG. 2D, the capillary 5 is released from the lead 2.

The conventional resin sealing process will subsequently be described.

With reference to FIG. 3A, the wire-bonded pellet and the leads are placed in cavity of dies 9.

With reference to FIG. 3B, a molten resin 10 is flowing from the gate positioned at a corner to fill up the cavity of the dies 9 in which the wire-bonded pellet and the leads are placed.

With reference to FIG. 3C, the molten resin 10 has filled up the cavity of the dies 9 and the wire-bonded pellet and the leads are sealed with the resin 10.

FIG. 4 is a plane view illustrative of wires extending between the leads and the pellet on the island after the sealing resin has filled up the cavity of the dies and has sealed the semiconductor device. The molten resin was flowing from the gate 8 into the cavity of the dies 9. Each wire is fixed at opposite ends to the pellet and the leads but not fixed at intermediate portions thereof. The wires extending in a direction nearly parallel to the flow direction of the molten resin are not so carried. By contrast, the wires extending in a direction nearly vertical to the flow direction of the molten resin are largely carried by the flow of the molten resin.

Particularly when the density of the wires is high, it is possible that the wires are largely carried by the flow of the molten resin so that the wires are made into contact with each other thereby to form a short circuit. At the corners, the distance of the adjacent two wires is narrower than the other positions, for which reason the wires at the corners are likely to be made into contact with each other thereby to form a short circuit.

In the above circumstances, it had been required to develop a novel lead frame structure which prevents the each wire from being largely carried by the flow of the molten resin thereby to prevent formation of short circuit.

SUMMARY OF THE INVENTION

Accordingly, it is an object of the present invention to provide a novel lead frame structure which prevents the wires from being largely carried by the flow of the molten resin in order to avoid the formation of short circuit.

It is a further object of the present invention to provide a novel method of wire-bonding between a pellet and improved leads which prevents the wires from being largely carried by the flow of the molten resin thereby to prevent the formation of short circuits.

The above and other objects, features and advantages of the present invention will be apparent from the following descriptions.

In accordance with the present invention, each of the lead frames has a forked top portion which has a recessed portion adjusted for receipt of a wire so that the wire is so caught by the forked top portion as to prevent the wire from being largely carried. Even if the density of the wires is high, the wires are not carried by the flow of the molten resin so that the wires are kept from contact with each other. At the corners, the distance of the adjacent two wires is narrower than the other positions. Notwithstanding, the wires at the corners are also prevented by the forked top portion of the lead frame from being largely carried by the flow of the molten resin so that the wires are kept from contact with each other thereby circuits.

In accordance with the further present invention, the wire is first bonded at its one end by the capillary to the pellet on the island. The capillary is then moved from the pellet to a plate positioned under the forked top portion of the lead frame to bond the wire onto the plate so that the wire is so caught by the forked top portion as to prevent the wire from being largely carried, wherein the plate is slightly distanced from the bottom surface of the lead frame. The capillary has been separated from the plate before the plate is lifted up to the bottom surface of the lead frame so that the opposite end of the wire is fixed to the bottom surface of the lead frame. Even if the density of the wires is high, the wires are not carried by the flow of the molten resin so that the wires are kept from contact with each other thereby preventing any short circuits. At the corners, the distance of the adjacent two wires is narrower than the other positions. Notwithstanding, the wires at the corners are also prevented by the forked top portion of the lead frame from being largely carried by the flow of the molten resin so that the wires are kept from contact with each other thereby to prevent any short circuits.

BRIEF DESCRIPTION OF THE DRAWINGS

Preferred embodiments according to the present invention will be described in detail with reference to the accompanying drawings.

PREFERRED EMBODIMENT

A preferred embodiment according to the present invention will be described with reference to FIGS. 5, 6A through 6D, and 7.

Figure 1:
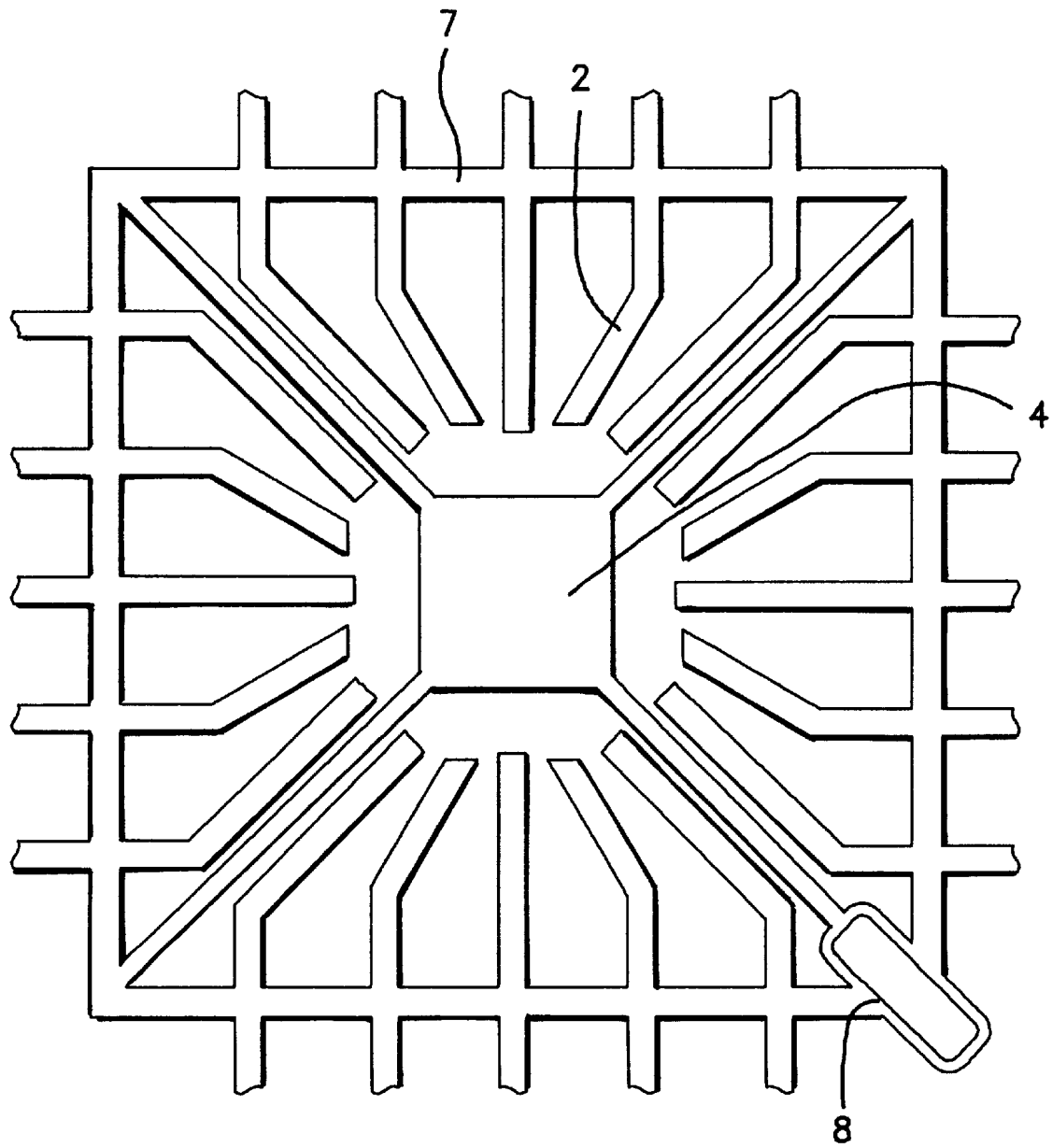
FIG. 1 is a plane view illustrative of a lead frame to be used for wire-bonding and resin-sealing.
Figure 2A:
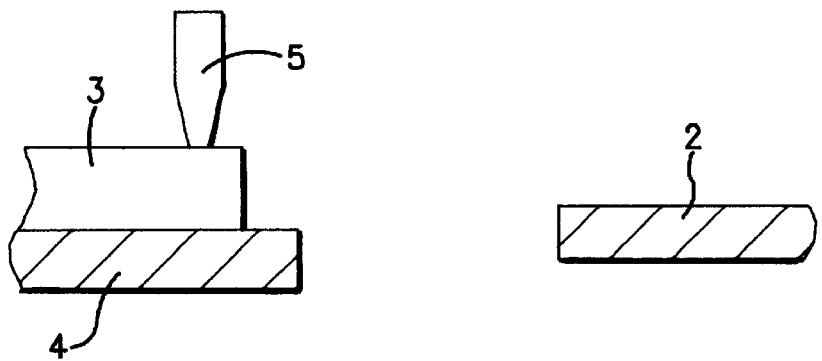
FIGS. 2A through 2D are views illustrative of the conventional wire-bonding processes.
Figure 2B:
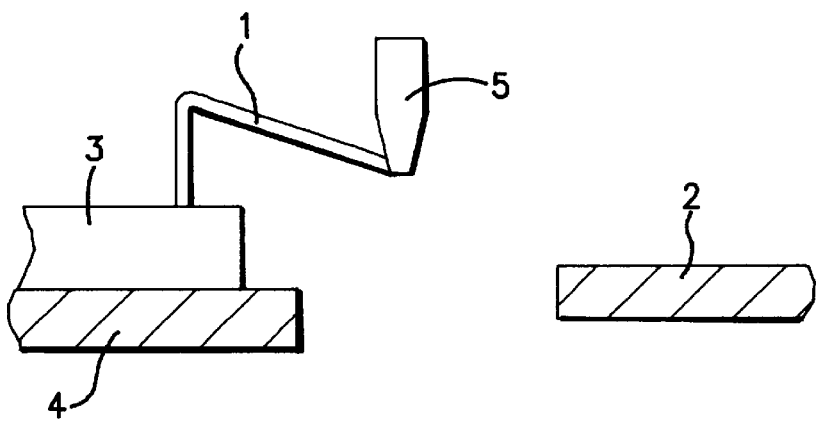
Figure 2C:
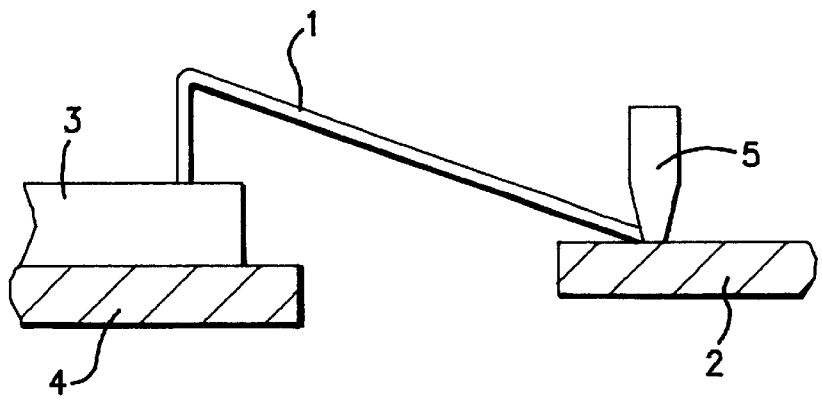
Figure 2D:
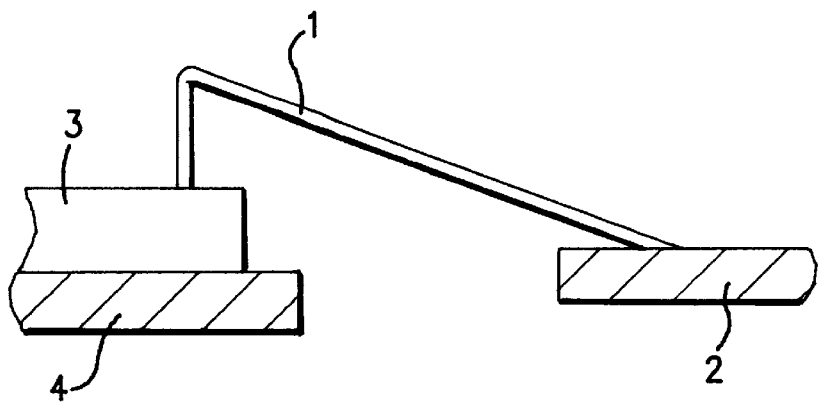
Figure 3A:
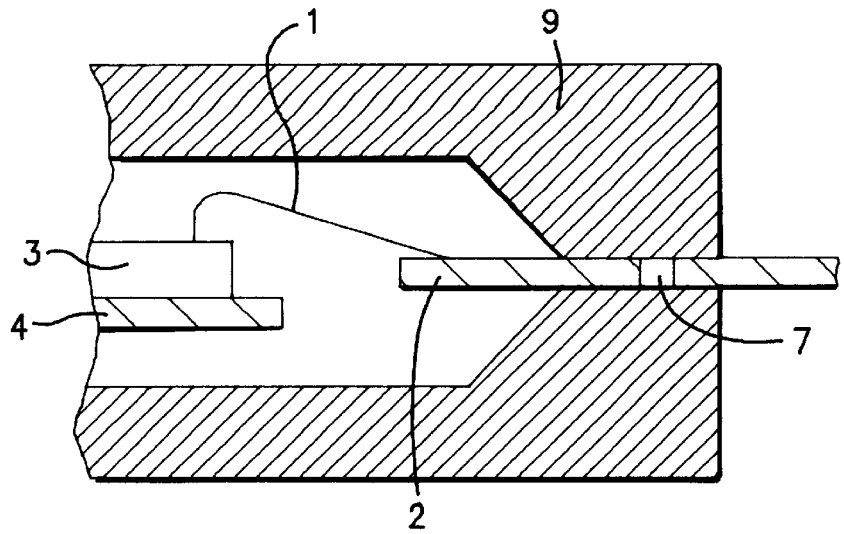
FIGS. 3A through 3C are views illustrative of the conventional resin-sealing processes.
Figure 3B:
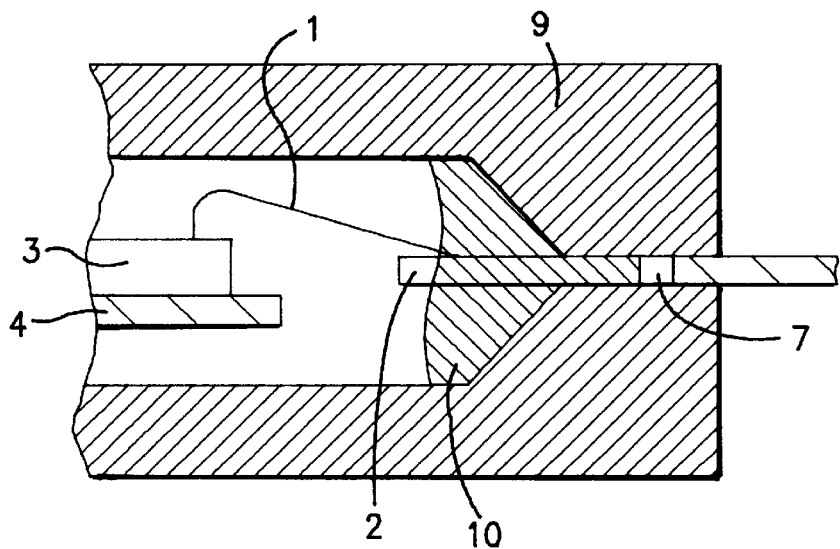
Figure 3C:
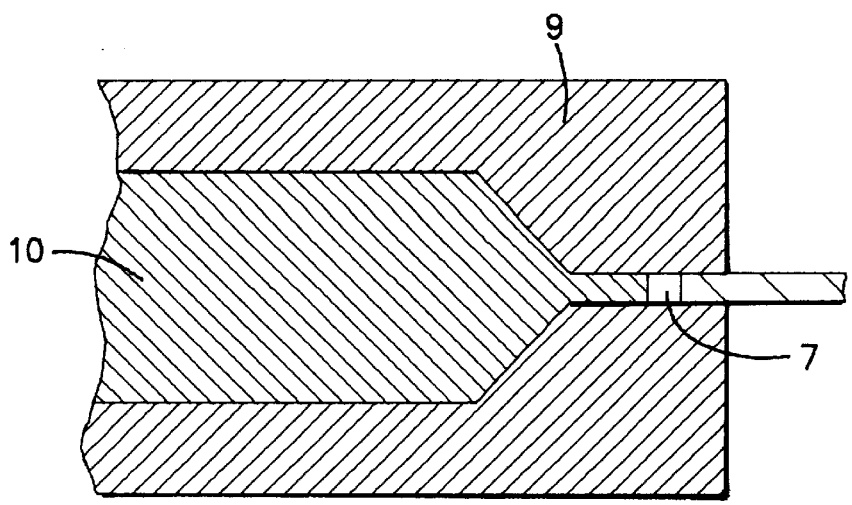
Figure 4:
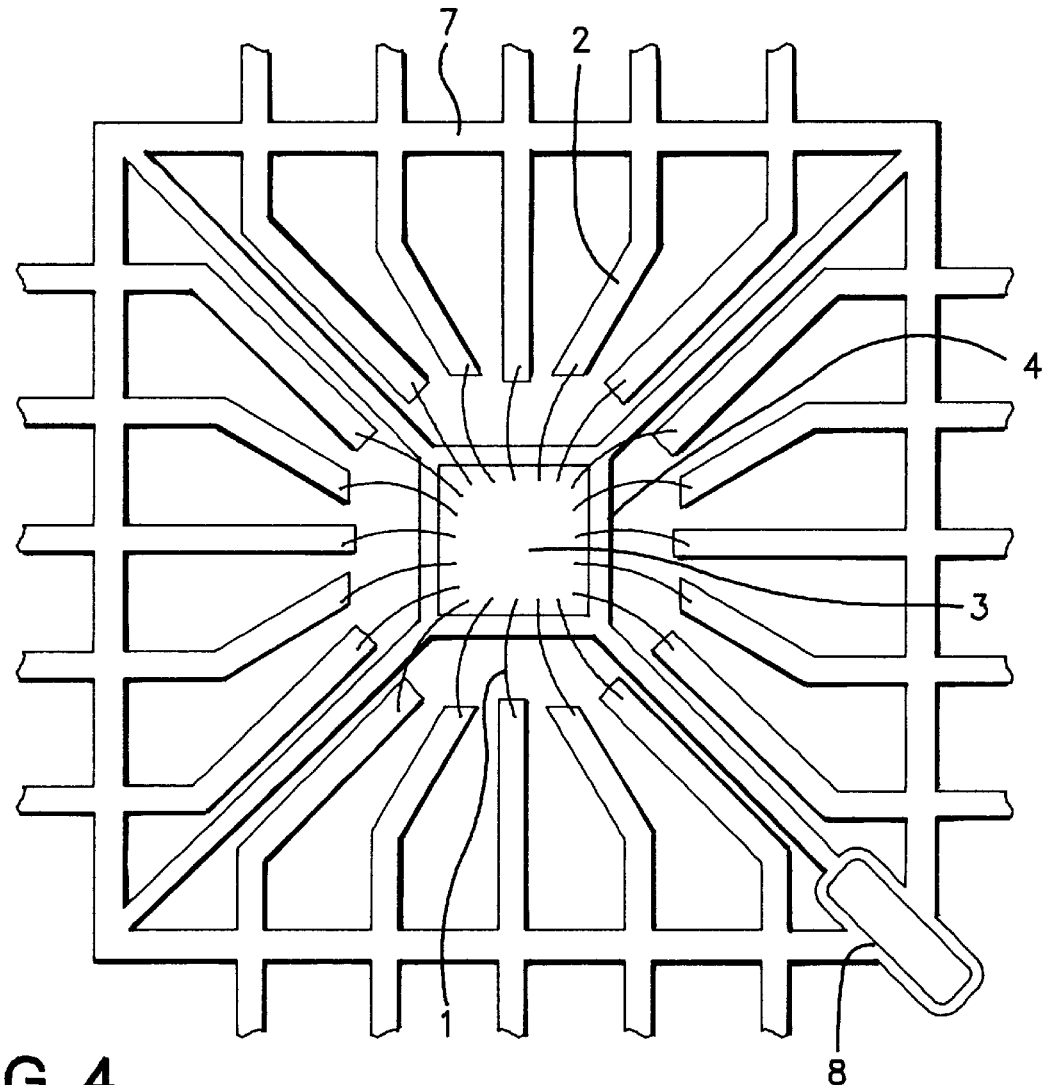
FIG. 4 is a plane view illustrative of the conventional wires extending between the leads and the pellet on the island after the sealing resin has filled up the cavity of the dies and has sealed the semiconductor device.
Figure 5:
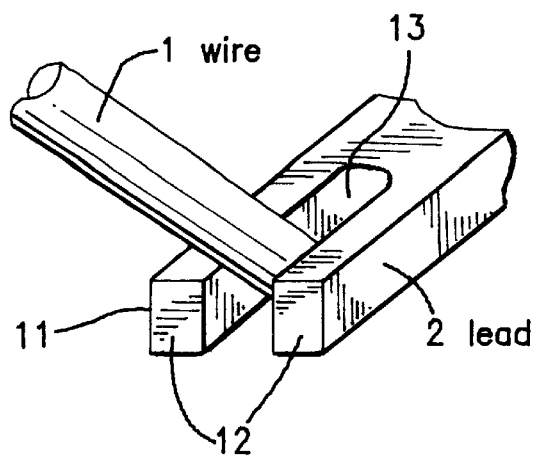
FIG. 5 is a schematic perspective view illustrative of an improved forked top portion of the lead frame and a wire caught by the forked top portion in a preferred embodiment according to the present invention.
Figure 7A:
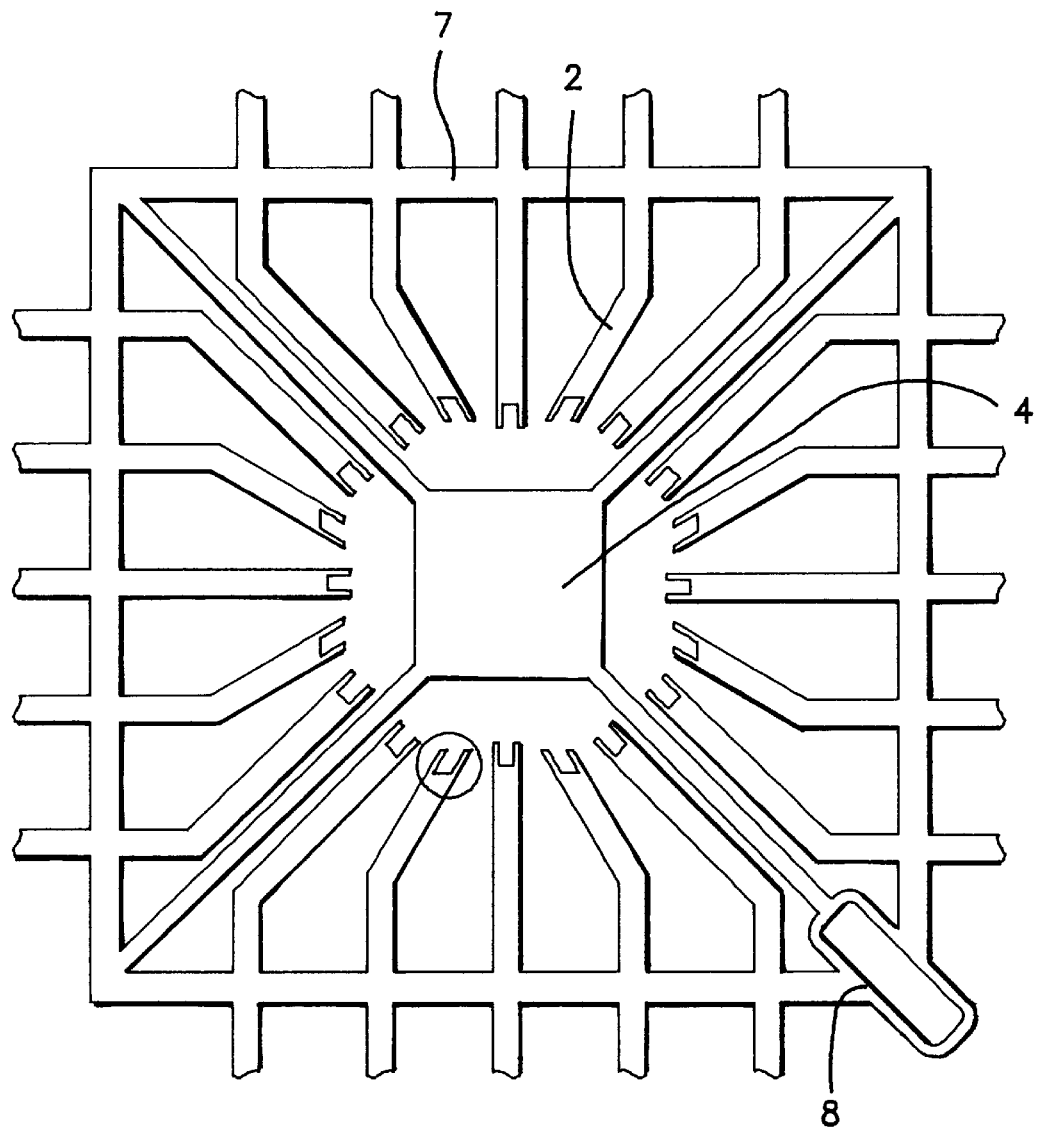
FIG. 7 is a view of the lead frame of the present invention.
Figure 7B:
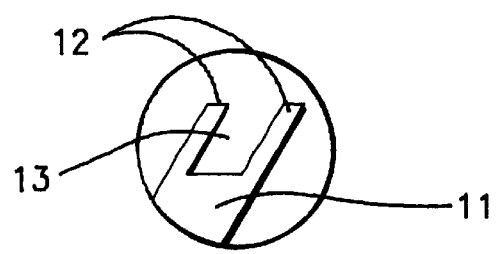

With reference to FIGS. 5 and 7, each of the lead frames 2 has plural leads with lead ends 11, each lead end having a forked top portion which has a recessed portion adjusted for receipt of a wire 1 so that the wire 1 is caught by the forked top portion so as to prevent the wire 1 from being largely carried by the flow of the molten resin. The forked top portion comprises two forked fingers 12 which surround a notched opening 13. Even if the density of the wires 1 is high, the wires 1 are not carried by the flow of the molten resin so that the wires 1 are kept from contact with each other thereby preventing short circuits. At the corners, the distance of the adjacent two wires 1 is narrower than the other positions. Notwithstanding, the wires 1 at the corners are also prevented by the forked top portion of the lead frame 2 from being largely carried by the flow of the molten resin so that the wires 1 are kept from contact with each other.

Figure 6A:
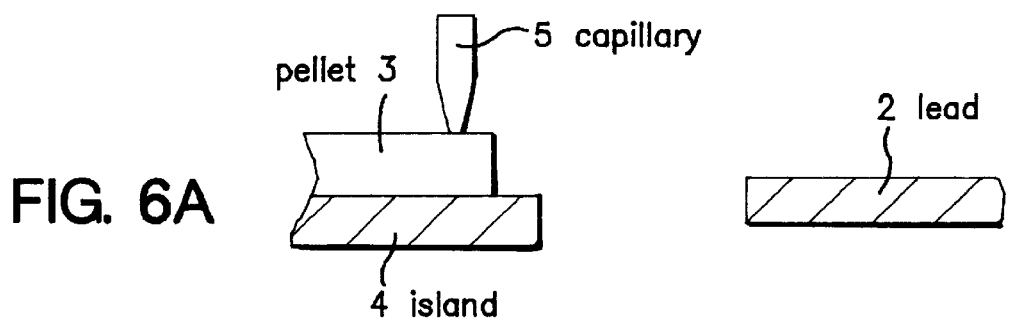
FIGS. 6A through 6D are views illustrative of novel wire-bonding processes in a preferred embodiment according to the present invention.

With reference to FIG. 6A, the wire 1 is first bonded at its one end by a capillary 5 onto a pellet 3 placed on an island 4.

Figure 6B:
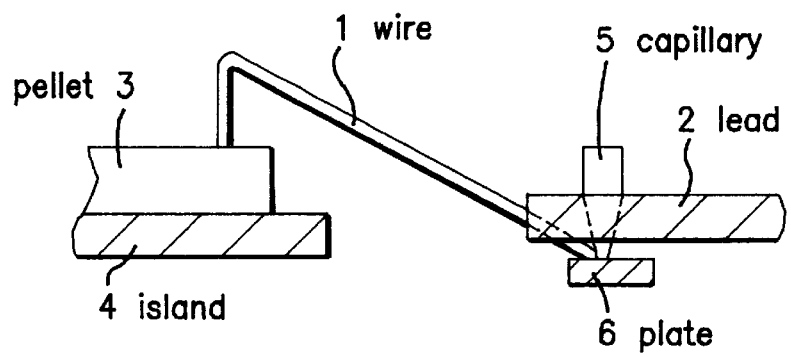

With reference to FIG. 6B, the capillary 5 is then moved from the pellet 3 to a wire plate 6 positioned under the forked top portion of the lead frame 2 to bond the wire 1 onto the plate 6 so that the wire 1 is caught by the forked top portion of the lead frame 2 so as to prevent the wire 1 from being largely carried, wherein the plate 6 is slightly distanced from the bottom surface of the lead frame 2.

Figure 6C:
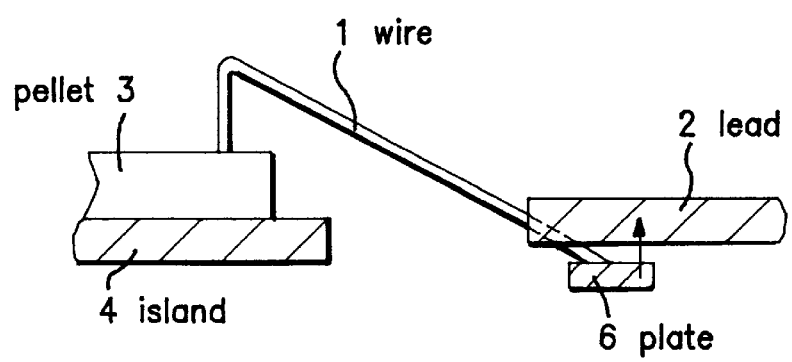

With reference to FIG. 6C, the capillary 5 has been separated from the plate 6 before the plate 6 is then lifted up to the bottom surface of the lead frame 2 so that the opposite end of the wire 1 is fixed onto the bottom surface of the lead frame 2.

Figure 6D:
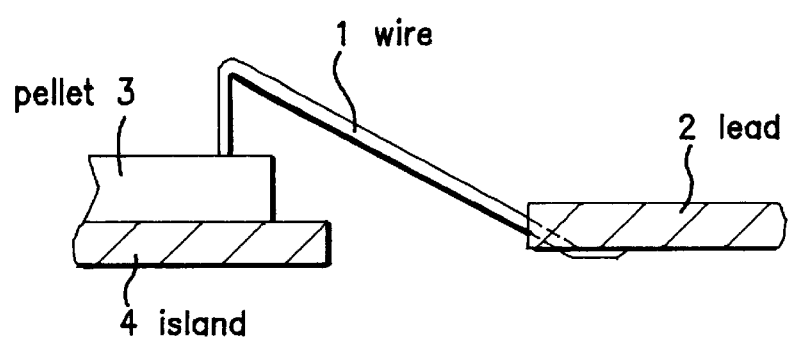

With reference to FIG. 6D, the plate 6 is separated from the bottom surface of the lead frame 2. As a result, the wire 1 is caught by the forked top portion of the lead frame 2 so as to prevent the wire 1 from being largely carried by the flow of the molten resin. Even if the density of the wires 1 is high, the wires 1 are not carried by the flow of the molten resin so that the wires 1 are kept from contact with each other thereby preventing the formation of a short circuit. At the corners, the distance of the adjacent two wires 1 is narrower than the other positions. Notwithstanding, the wires 1 at the corners are also prevented by the forked top portion of the lead frame 2 from being largely carried by the flow of the molten resin so that the wires 1 are kept from contact with each other thereby also preventing short circuit.

Whereas modifications of the present invention will be apparent to a person having ordinary skill in the art, to which the invention pertains, it is to be understood that embodiments as shown and described by way of illustrations are by no means intended to be considered in a limiting sense.

Accordingly, it is to be intended to cover by claims all modifications which fall within the spirit and scope of the present invention.

What is claimed is:

1. A wire-bonding lead frame comprising an island, a tie bar, and plural leads extending from said tie bar toward said island, said leads comprising lead ends parallel with said island, said lead ends comprising forked fingers surrounding a notched opening, said forked fingers designed and adapted to received and engage a wire so that the wire is caught by said forked fingers so as to prevent the wire from being disengaged by application of an external force.

2. The wire-bond lead frame of claim 1, wherein said lead ends are designed and adapted to accept wires passing through said lead ends from a lead end upper surface to a lead end lower surface, for bonding to said lead end lower surface.

3. The wire-bond lead frame of claim 1, wherein said lead ends are approximately coplanar with said island.

4. The wire-bond lead frame of claim 2, in combination with wire plates, said wire plates designed and adapted to bond with one end of the wires and to bond said wires to said lead end lower surface.

5. A semiconductor device comprising:
   a wire-bonding lead frame comprising plural leads surrounding and radiating out from an island, said leads comprising forked lead ends located approximately parallel with said island;
   a pellet mounted on said island; and
   wires having first ends bonded to said pellet and second ends, passing through said forked lead ends from an upper surface to a lower surface, bonded to said lower surface,
   wherein said forked lead ends engage said wire so as to prevent said wires from being disengaged from said forked lead ends by application of an external force.

* * * * *